United States Patent
Wiesinger et al.

(10) Patent No.: US 10,094,899 B2
(45) Date of Patent: Oct. 9, 2018

(54) MAGNETIC RESONANCE T2 PREPARATORY PULSES FOR MAGNETIC FIELD INHOMOGENEITY ROBUSTNESS AND CONTRAST OPTIMIZATION

(71) Applicant: General Electric Company, Schenectady, NY (US)

(72) Inventors: Florian Wiesinger, Freising (DE); Martin Andreas Janich, Munich (DE); Ana Beatriz Solana Sanchez, Munich (DE); Nicolas Hehn, Munich (DE)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 253 days.

(21) Appl. No.: 15/228,881

(22) Filed: Aug. 4, 2016

(65) Prior Publication Data

US 2018/0038928 A1  Feb. 8, 2018

(51) Int. Cl.
  G01R 33/50 (2006.01)
  G01R 33/561 (2006.01)
  G01R 33/565 (2006.01)

(52) U.S. Cl.
  CPC ......... *G01R 33/50* (2013.01); *G01R 33/5618* (2013.01); *G01R 33/5659* (2013.01)

(58) Field of Classification Search
  CPC ............ G01R 33/5659; G01R 33/5618; G01R 33/561
  See application file for complete search history.

(56) References Cited

U.S. PATENT DOCUMENTS

| | | | |
|---|---|---|---|
| 7,176,687 B2 | 2/2007 | Jenniskens et al. | |
| 7,375,520 B2 | 5/2008 | Nezafat et al. | |
| 7,498,808 B2 | 3/2009 | Asano | |
| 7,787,930 B2 | 8/2010 | Nezafat et al. | |
| 8,797,031 B2 | 8/2014 | Rehwald et al. | |
| 2006/0284615 A1* | 12/2006 | Nazafat ............. | G01R 33/5635 324/307 |
| 2014/0062477 A1* | 3/2014 | Carroll ............... | G01R 33/4826 324/309 |
| 2014/0088407 A1 | 3/2014 | Shin et al. | |
| 2015/0002149 A1 | 1/2015 | Nehrke et al. | |

(Continued)

OTHER PUBLICATIONS

Conolly et al., "Optimal control solutions to the magnetic resonance selective excitation problem", Medical Imaging, IEEE Transactions, vol. 5, Issue 2, pp. 106-115, 1986.

(Continued)

*Primary Examiner* — Giovanni Astacio-Oquendo
*Assistant Examiner* — Alvaro Fortich
(74) *Attorney, Agent, or Firm* — GE Global Patent Operation; Pabitra Chakrabarti

(57) ABSTRACT

Methods and systems to obtain and apply $T_2$ preparatory radiofrequency (RF) pulse sequences for magnetic resonance imaging (MRI) are provided. The iterative methods may employ propagation of the magnetization state of the object being imaged and a comparison with a target magnetization state. The methods disclosed may be used to obtain MRI pulse sequences that may optimize $T_2$ relaxation contrast. The produced RF pulse sequences may be robust to effects from inhomogeneity of the magnetic fields or other environmental or physiological perturbations.

20 Claims, 8 Drawing Sheets

(56) References Cited

U.S. PATENT DOCUMENTS

2015/0355304 A1* 12/2015 Kurokawa ............. A61B 5/055
324/309

OTHER PUBLICATIONS

Hasse, "Snapshot Flash MRI. Applications to T1, T2, and chemical-shift imaging", Magnetic Resonance in Medicine, vol. 13, Issue 1, pp. 77-89, Jan. 1990.

Edelman et al., "Segmented turboFLASH: method for breath-hold MR imaging of the liver with flexible contrast", Radiology, vol. 177, Issue 2, pp. 515-521, 1990.

Mugler et al., "T2-weighted three-dimensional MP-RAGE MR imaging", Journal of Magnetic Resonance Imaging, vol. 1, Issue 6, pp. 731-737, 1991.

Brittain et al. "Coronary angiography with magnetization-prepared T2 contrast", Magnetic resonance in medicine, vol. 33, Issue 5, pp. 689-696, 1995.

Botnar et al. "Improved coronary artery definition with T2-weighted, free-breathing, three dimensional coronary MRA", Circulation, vol. 99, Issue 24, pp. 3139-3148, 1999.

Garwood et al., "The return of the frequency sweep: designing adiabatic pulses for contemporary NMR", Journal of Magnetic Resonance, vol. 153, Issue 2, pp. 155-177, 2001.

Skinner et al. "Application of optimal control theory to the design of broadband excitation pulses for high-resolution NMR", Journal of Magnetic Resonance, vol. 163, Issue 1, pp. 8-15, 2003.

Kobzar et al. "Exploring the limits of broadband excitation and inversion pulses", Journal of Magnetic Resonance, vol. 170, Issue 2, pp. 236-243, 2004.

De Bazelaire et al., "MR Imaging Relaxation Times of Abdominal and Pelvic Tissues Measured in Vivo at 3.0 T", Preliminary Results, Radiology, 2004.

Kobzar et al., "Pattern pulses: design of arbitrary excitation profiles as a function of pulse amplitude and offset", Journal of Magnetic Resonance, vol. 173, pp. 229-235, 2005.

Nezafat et al. "B1-insensitive T2 preparation for improved coronary magnetic resonance angiography at 3 T", Magnetic Resonance in Medicine, vol. 55, Issue 4, pp. 858-864, Apr. 2006.

Hussain et al., "MR Imaging of the Female Pelvis at 3T", Magnetic Resonance Imaging Clinics of North America, vol. 14, Issue 4, pp. 537-544, 2006.

Kellman et al., "T2-prepared SSFP improves diagnostic confidence in edema imaging in acute myocardial infarction compared to turbo spin echo", Magnetic Resonance in Medicine, vol. 57, Issue 5, pp. 891-897, May 2007.

Kobzar et al. "Exploring the limits of broadband excitation and inversion: II. Rf-power optimized pulses", Journal of Magnetic Resonance, vol. 194, Issue 1, pp. 58-66, 2008.

Matson et al., "RF pulses for in vivo spectroscopy at high field designed under conditions of limited power using optimal control", Journal of Magnetic Resonance, vol. 199, Issue 1, pp. 30-40, 2009.

Nielsen et al., "Optimal control methods in NMR spectroscopy", eMagnetic Resonance, 2010.

Borneman et al., "Application of optimal control to CPMG refocusing pulse design" Journal of Magnetic Resonance, vol. 207, Issue 2, pp. 220-233, 2010.

Liu et al., "Flow-independent T2-prepared inversion recovery black-blood MR imaging", Journal of Magnetic Resonance Imaging, vol. 31, pp. 248-254, 2010.

Lapert et al., "Exploring the physical limits of saturation contrast in magnetic resonance imaging", Scientific Reports, 2, 2012.

Moore et al., "Evaluation of non-selective refocusing pulses for 7T MRI", Journal of Magnetic Resonance, vol. 214, Issue 1, pp. 212-220, 2012.

Jenista et al., "Motion and flow insensitive adiabatic T2-preparation module for cardiac MR imaging at 3 tesla", Magnetic Resonance in Medicine, vol. 70, pp. 1360-1368, 2013.

Von Knobelsdorff-Brenkenhoff et al., "Myocardial T1 and T2 mapping at 3 T: reference values, influencing factors and implications", Journal of Cardiovascular Magnetic Resonance, vol. 15, Issue 53, 2013.

Soleimanifard et al., "Spatially selective implementation of the adiabatic T2 prep sequence for magnetic resonance angiography of the coronary arteries", Magnetic Resonance in Medicine, vol. 70, pp. 97-105, 2013.

Hua et al., "Whole-brain three-dimensional T2-weighted BOLD functional magnetic resonance imaging at 7 tesla", Magnetic Resonance in Medicine, 2013.

Lopez et al., "Relaxation selective pulses in fast relaxing systems", Journal of Magnetic Resonance, vol. 242, pp. 5-106, 2014.

Solana et al., "Quiet and distortion-free, whole-brain BOLD fMRI using T2-prepared RUFIS MR imaging", Magnetic Resonance in Medicine, 2015.

* cited by examiner

MAGNETIC RESONANCE T2 PREPARATORY PULSES FOR MAGNETIC FIELD INHOMOGENEITY ROBUSTNESS AND CONTRAST OPTIMIZATION

BACKGROUND

The subject matter disclosed herein relates to magnetic resonance imaging (MRI), and more specifically, to systems and methods for producing $T_2$ contrast preparatory pulses that are robust to magnetic field inhomogeneity and other imperfections like flow or motion, and optimize image contrast.

Generally, an MRI image of a subject (e.g., a patient) is produced by measuring properties of the gyromagnetic materials of the subject, such as hydrogen nuclei. These properties are usually obtained by measurement of emissions of the gyromagnetic materials as a response to an excitation from an application of magnetic fields. These magnetic fields generally include a strong primary magnetic field, magnetic field gradients, and radiofrequency (RF) magnetic field excitation pulses.

An MRI system may be used to produce different types of contrast based on a combination of properties of the gyromagnetic materials and the manner in which the magnetic fields are applied. For example, an MRI system may produce proton density images, $T_1$-weighted images, $T_2$-weighted images, etc., based on its suitability for the application. In some medical contexts, for example, $T_1$-weighted images may be suitable to highlight fat tissue, while $T_2$-weighted images may be suitable to highlight water content.

A contrast manipulation pulse sequence prior to data acquisition may improve the quality of the obtained image. One of these contrast manipulation pulses can be a $T_2$ preparation pulse. Usually, $T_2$ preparatory pulses are composed by a series of non-selective block pulses, which are susceptible to magnetic field inhomogeneity, and may lead to undesired artifacts in the image.

BRIEF DESCRIPTION

In one embodiment, a method to obtain magnetic resonance images employing a $T_2$ preparatory RF pulse sequence is provided. The preparatory RF pulse may enhance a target $T_2$ relaxation contrast. The method may include simulation of a magnetization state of a subject being imaged based on material parameters of the subject, magnetic fields of the magnetic resonance system and the candidate RF pulse, an assessment of the results of the simulation based on a calculation of the quality of the pulse and a comparison between the quality of the pulse calculation and a quality threshold. Based on the comparison, the candidate RF pulse may be updated based on differences between the result of the simulation and a target $T_2$ relaxation contrast. Iterations of these steps may take place until the quality of the candidate RF pulse satisfies the quality threshold.

In another embodiment, a magnetic resonance imaging system comprising a module that obtains a $T_2$ preparatory RF pulse sequence is described. The method performed by the module may include a simulation of a magnetization state of a subject being imaged based on the magnetic field of the magnetic resonance system and the candidate RF pulse, a calculation of the quality of the RF pulse through the comparison of the results of the simulation with a target $T_2$ contrast and an update of the candidate RF pulse sequence based on the comparison between the results of the simulation and the target $T_2$ preparation RF pulses.

A further embodiment describes a module that obtains a $T_2$ preparatory RF pulse sequence that may optimize a specific $T_2$ contrast and which may be coupled to a magnetic resonance imaging system. To obtain the $T_2$ preparatory RF pulse, the module may perform a method which may include a simulation of a magnetization state of a subject being imaged based on the magnetic field of the magnetic resonance system and the candidate pulse sequence, a calculation of the quality of the pulse through the comparison of the results of the simulation with a target contrast and an update of the candidate RF pulse based on the comparison between the results of the simulation and the target $T_2$ result.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
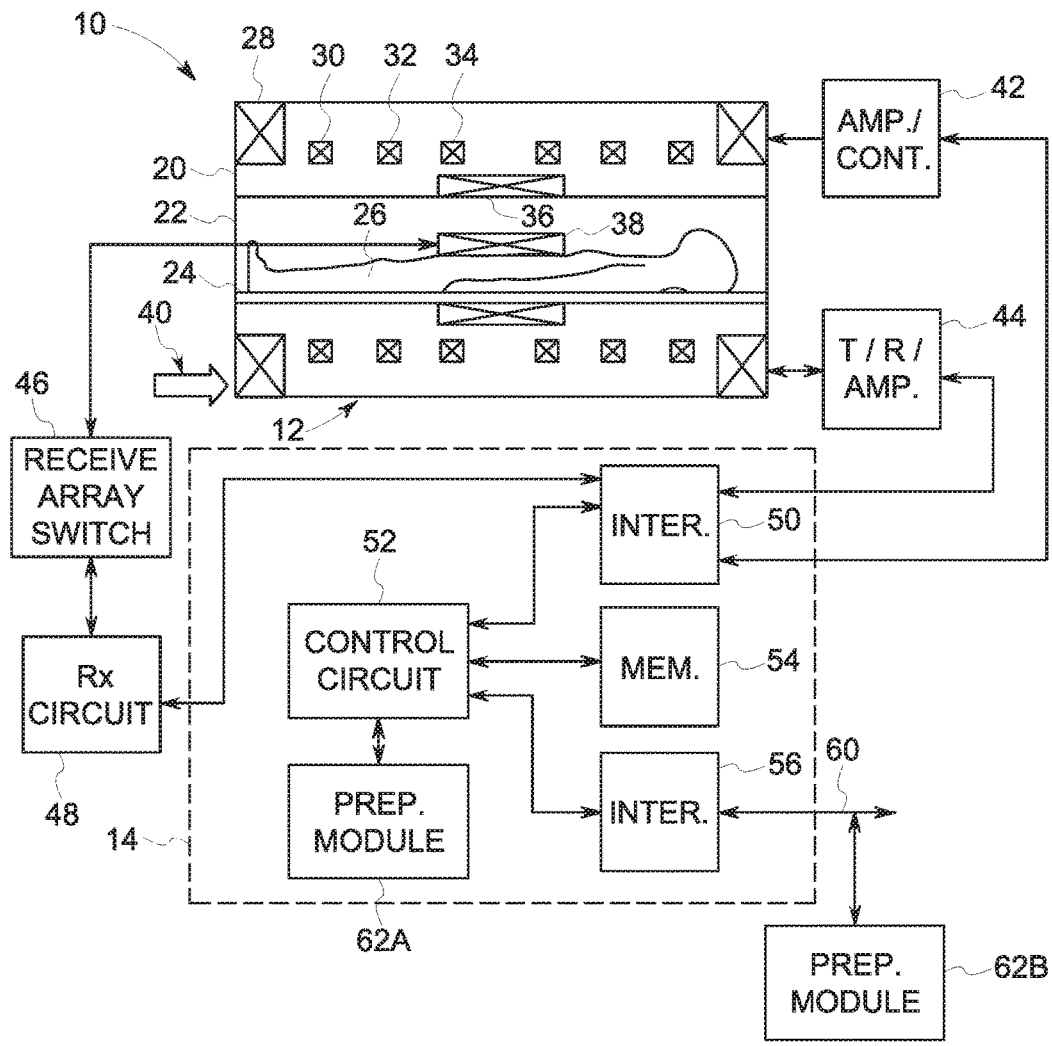
FIG. 1 illustrates a diagram of a magnetic resonance imaging (MRI) system that employs a contrast preparation module, in accordance with an embodiment of the present disclosure.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with safety-related, system-related and business-related constraints, which may vary from one implementation to another. Moreover, it should be appreciated that such a development effort might be complex and time consuming, but would nevertheless be a routine undertaking of design, fabrication and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. The terms "RF pulse" and "pulse sequence" are intended to be interchangeable, as a single RF pulse can be considered as a sequence of multiple very short RF pulses.

Magnetic resonance imaging (MRI) uses systems capable of producing an image that maps specific properties of gyromagnetic materials of the object being imaged. More specifically, MRI systems measure the radiofrequency (RF) emission from gyromagnetic nuclei of the objects being imaged as a response to magnetic field perturbations created by coils of the MRI system. Usually, the object is immersed in a strong constant magnetic field ($B_0$) and is subject to variable magnetic field gradients and RF excitation pulses that generate a magnetic field ($B_1$). Magnetic field gradients may be applied by gradient coils, which may be used to generate different magnetization of the gyromagnetic materials in different regions of the object being imaged. The RF excitation pulses may be applied by RF excitation coils and may be used to excite the magnetization vector of the gyromagnetic materials through precession. A pulse sequence, a specific series of applications of these magnetic fields to the subject, may be employed to obtain suitable data from the MRI system to produce an image of an object.

An MRI system may be used to produce multiple types of images with different imaging contrasts based on the different properties of the gyromagnetic materials of the object being imaged. For example, an MRI image may highlight differences between proton density, $T_1$ relaxation times or $T_2$ relaxation times. Different choices of contrast may produce images such as proton density images, complex (magnitude and phase) images, $T_1$, $T_2$ or $T_2^*$-weighted images, and other types. The different types of image may be useful to identify different tissues, which ultimately may improve the diagnostic power of the MRI system.

Some types of images are benefited by the application of specific pulse sequences that enhances the contrast based the different gyromagnetic properties. For example, a $T_1$-weighted image may be obtained by using a pulse sequence that enhances differences between regions of the object presenting different $T_1$ relaxation times. On the other hand, a $T_2$-weighted image may be obtained using a pulse sequence that enhances differences between regions of the object presenting different $T_2$ relaxation times. As part of the pulse sequence, a preparatory pulse sequence may be used to drive the magnetization of the gyromagnetic nuclei of the object being imaged to a target state that may lead to a desired level of contrast appropriate for the application. In accordance with present embodiments, numerical methods, such as the ones detailed below, may be employed to obtain $T_2$ preparatory pulses that improve $T_2$ contrast. Furthermore, the numerical methods may provide preparatory pulse sequence that specify the contrast scale (e.g., linear, inverse, logarithmic).

Moreover, in applications employing high magnetic field strengths, and when the objects are large, imperfections in the applied magnetic fields may lead to magnetic field inhomogeneity. Numerical methods, such as the ones detailed below, may be used to obtain pulse sequences that are robust to the effects from such inhomogeneity. Furthermore, the discussed methods may provide pulse sequences that mitigate artifacts due to $B_1$ inhomogeneity, off-resonance effects, chemical shift effects, flow effects, specific absorption rate, etc. An RF pulse design (including but not limited to pulse simulation, quality function and gradient calculation) that mitigate these effects may be similar to the methods to obtain RF pulses that have $B_1$-robustness described herein.

While the techniques described herein may be performed using a variety of types of MRI systems, an example of an MRI system 10 is shown schematically in FIG. 1. The MRI system 10 includes a scanner 12 and a scanner control system 14. The scanner 12 may have a housing 20 through which a bore 22 is formed. A movable table 24 may be used to allow a patient 26 to be positioned within the bore 22. The housing 20 of the scanner 12 may also include a primary magnet 28, which may establish a primary magnetic field for data acquisition. Magnetic gradient coils 30, 32 and 34 positioned in the scanner 12 may provide a magnetic field gradient that provides positional encoding of some of the gyromagnetic nuclei of the patient 26 during the imaging process. An RF excitation coil 36 of the system 10 may generate radiofrequency (RF) pulses for excitation of part of the gyromagnetic nuclei of the patient 26 during the imaging process. The MRI system 10 may also be provided with acquisition coils 38, which may read out RF signals produced by gyromagnetic nuclei within the patient 26 as the nuclei go from an excited state to a relaxed state. In some embodiments, the RF excitation coil 36 and the acquisition coil 38 may be substantially the same. The various coils and magnets of the scanner 12 may be powered by a main power supply 40.

The magnetic gradient coils 30, 32, 34 may be controlled by a driver circuit 42, which adjust the currents flowing through the magnetic gradient coils 30, 32, 34 and control their magnetic field. The RF excitation coil 36 may be controlled by a driver circuit 44 that may control intensity, frequency, phase, duration and time of RF pulses. Receive circuit 48 may acquire RF signals detected by the acquisition coil 38 and processed by a receive array switch 46. The driver circuits 42 and 44, and the acquisition coil 38 may be coupled, through an interface 50, to a control circuit 52. The control circuit 52 may include a general purpose processor, an application-specific integrated circuit (ASIC) and/or a programmable logic device (PLD). The control circuit 52 may communicate with a memory circuitry 54, which may store data acquired through the receive circuit 48. The memory circuitry 54 may also store instructions for the control circuit 52 and for the driver circuits 42 and 44 to control the gradient coils 30, 32, 34 and the RF excitation coil 36, respectively, in a particular manner. Moreover, scanner control interface 14 may have an interface 56 that allows a connection 60 between the MRI system 10 and other external equipment such as a computer cluster for image reconstruction or registration, a medical database, a diagnostic system, a PACS system, a display, a printer, a 3-D visualization interface or any other device that may use MRI images or data.

The memory circuitry 54 may also store instructions to control the receive circuit 48. Memory circuitry 54 may also contain instructions to produce an image from the data stored. The instructions may enable production of a proton-density, a $T_1$, a $T_2$, or a $T_2^*$-weighted image, for example. The memory circuitry 54 may also store instructions for the scanner 12 to perform excitation pulse sequences, read-out pulse sequences and/or a gradient encoding sequence.

Alternatively or additionally, the MRI system 10 may have a preparatory pulse module, such as an internal preparatory pulse module 62A or an external preparatory pulse module 62B, that may be used to calculate and/or perform preparatory RF pulse sequences. The internal preparatory pulse module 62A may be, for example, a programmable logic device, an application-specific integrated circuit, or a memory device storing instructions for a computer. The external preparatory pulse module 62B may be, for example, a dedicated electronic device directly attached to the MRI system 10, an external server, a supercomputing cluster, or a network of servers connected to the interface 56 through, for example, the connection 60. The preparatory pulse modules 62A or 62B or the memory circuitry 54 may perform or contain instructions for a general processor to calculate and/or perform preparatory pulse sequences using the methods and systems described herein.

Figure 2:
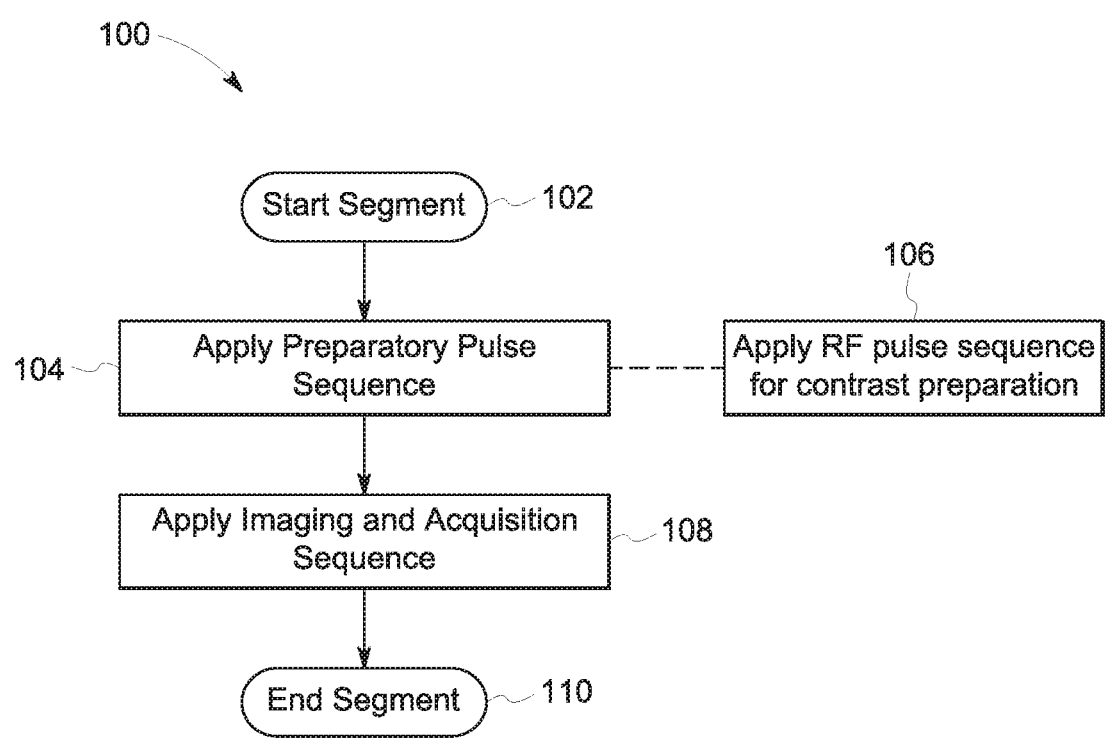
FIG. 2 illustrates a flow chart of an MRI technique that employs a preparatory pulse sequence, in accordance with an embodiment of the present disclosure.

One embodiment of a method employing such a sequence is shown in FIG. 2. In particular, FIG. 2 illustrates a segmented readout method 100 to obtain data from a subject being imaged with an MRI system (e.g., MRI system 10). In each iteration of the segmented readout method 100, data corresponding to a segment (i.e., a region of the frequency space, or k-space) is obtained. At the beginning of each segment readout (block 102), a preparatory pulse sequence (block 104) may be applied. The preparatory pulse sequence may include instructions for RF excitation coils that prepare the magnetization of the subject for a specific contrast (block 106). A preparatory pulse sequence that optimizes $T_2$-weighted imaging may, for example, manipulate the magnetization of the constituent materials of the subject (e.g. tissues) such that materials with a short $T_2$ relaxation time may have a substantially small longitudinal magnetization whereas materials with a long $T_2$ relaxation time may have a larger longitudinal magnetization at the end of the preparatory pulse sequence. Such pulse sequences may be obtained by using the methods detailed below.

Following the application of the preparatory pulse sequence (block 104), an imaging and acquisition sequence (block 108) which may include gradient encoding sequences and data acquisition sequences, may be applied. Other pulse sequences, such as refocusing pulse sequences or spoiler sequences may also be applied during an imaging and acquisition sequence (block 108), before the end of a segment readout (block 110). The methods to obtain pulse sequences detailed below may be used to obtain refocusing pulse sequences, spoiler sequences and any other useful pulse sequences that may be performed through an RF coil. To form an image, multiple iterations of the method 100 may be applied to cover data corresponding to the multiple segments, based on the region being imaged and the type of image being generated.

Figure 3:
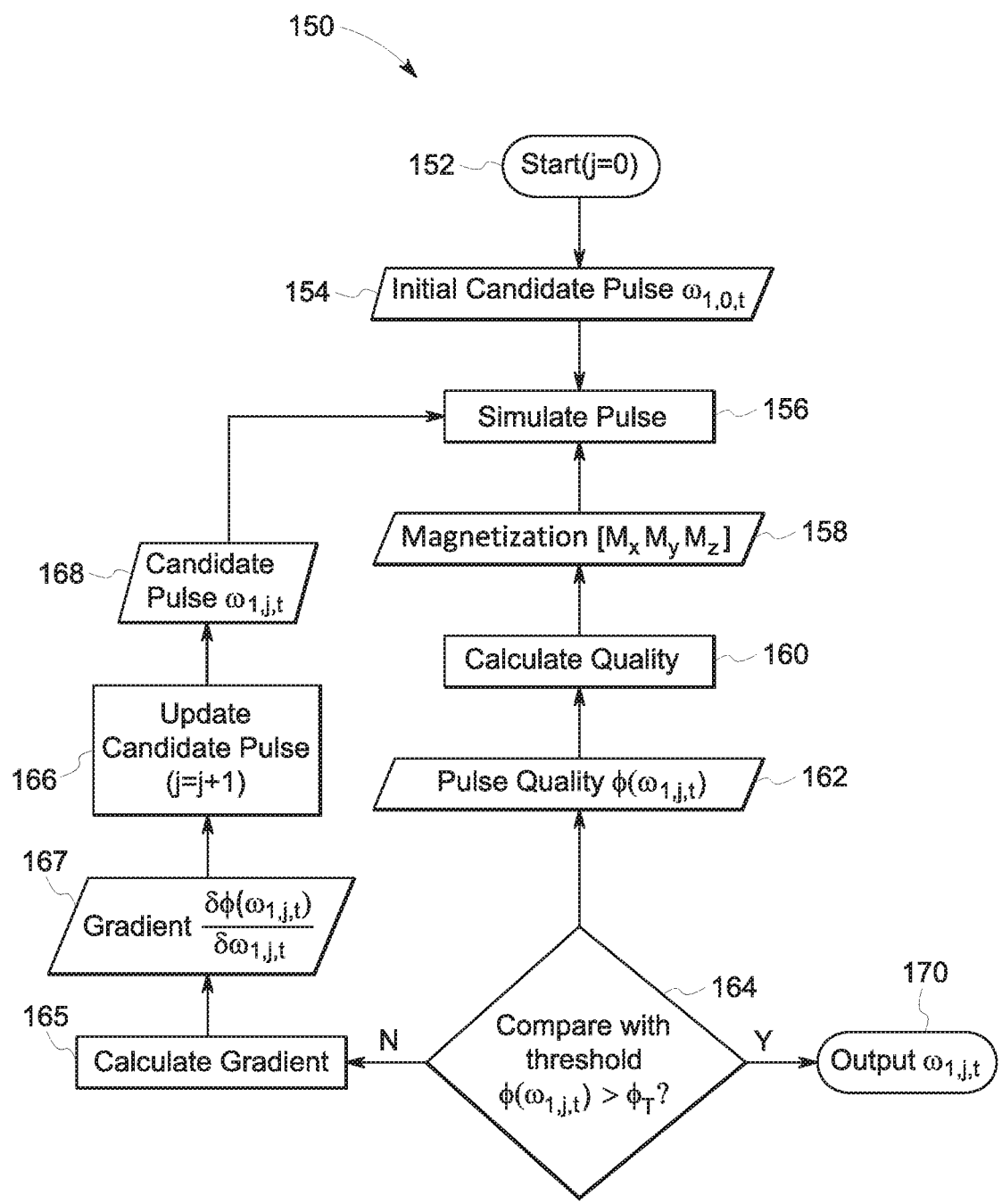
FIG. 3 illustrates a flow chart of an iterative technique to obtain a $T_2$ preparatory pulse sequence, in accordance with an embodiment of the present disclosure.

FIG. 3 illustrates a method 150 that may be used to obtain a $T_2$ preparatory pulse that may improve contrast and provide robustness to $B_1$ inhomogeneity and other undesirable effects. A preparatory pulse sequence obtained via iterations of the method 150 may have an improved performance as measured by a quality function that enhances an improved contrast and penalizes the undesirable effects, as described below.

The method 150 is initiated (block 152) by a selection of an initial candidate pulse sequence 154. The candidate pulse sequence 154 may contain instructions for the amplitude, phase, frequency, duration and timing of the currents in the RF excitation coils that may generate longitudinal magnetic fields generated by the RF excitation coil ($B_1$). The candidate pulse sequence 154 may be represented by $\omega_{1,j,t}$, wherein j identifies the iteration and t represents discrete time steps t=1, 2, . . . , N. In other implementations, the candidate pulse sequence 154 may be the representation of the longitudinal magnetic field produced by the RF excitation coil in terms of the intensity, phase, frequency, and duration of the excitation magnetic field. The effects of the pulse on a gyromagnetic material may be simulated (block 156) to obtain an evolution of the magnetization vector 158 of the gyromagnetic material. As detailed below, the simulation may take into account perturbations to the magnetic field $B_1$, different gyromagnetic properties, as well as other effects that can be modeled.

The evolution of the magnetization vector 158 resulting from the simulation (block 156) may be compared with a target magnetization vector (block 160) to obtain a calculated a pulse quality 162. Calculation of the pulse quality according to block 160 may be used to emphasize contrast by assigning a higher quality to a candidate pulse sequence that results in larger differences in the simulated magnetization vector 158 as response to different gyromagnetic properties. The calculation of the pulse quality (block 160) may also penalize undesired effects from field inhomogeneity by assigning higher quality to a candidate pulse sequence that results in smaller differences in the simulated magnetization vector 158 as a response to perturbations to magnetic fields (e.g., $B_0$ or $B_1$). As detailed below, other effects may be quantified in the calculation of the pulse quality (block 160).

The resulting pulse quality 162 may be compared to a pulse quality threshold (block 164). If the pulse quality 162 is below the pulse quality threshold, the candidate pulse may be adjusted (block 166). A gradient 167 calculated from a first derivative of the pulse quality 162 with respect to the candidate pulse (block 165) may be used in the adjustment of the candidate pulse (block 166). In some applications, the adjustment may be based on the function used to calculate the pulse quality (block 160) or in some other functional of the pulse quality function. The new candidate pulse 168 produced in the update (block 166) may be re-introduced into the method 150 as a new input to the next simulation performed according to block 156 and its quality may be quantified (block 160). Iterations of method 150, which may include the simulation (block 156), quality calculation (block 160), comparison (block 164), gradient calculation (block 165) and update (block 166) may be repeated until the pulse quality 162 is above the set threshold (block 164). The resulting pulse sequence 170 with a pulse quality 162 above the threshold (block 164) may be used to assist in the production of an image. Note further that while the example illustrates a minimum threshold, a maximum threshold may be used (e.g., to obtain a pulse quality below a pulse quality threshold).

Figure 4:
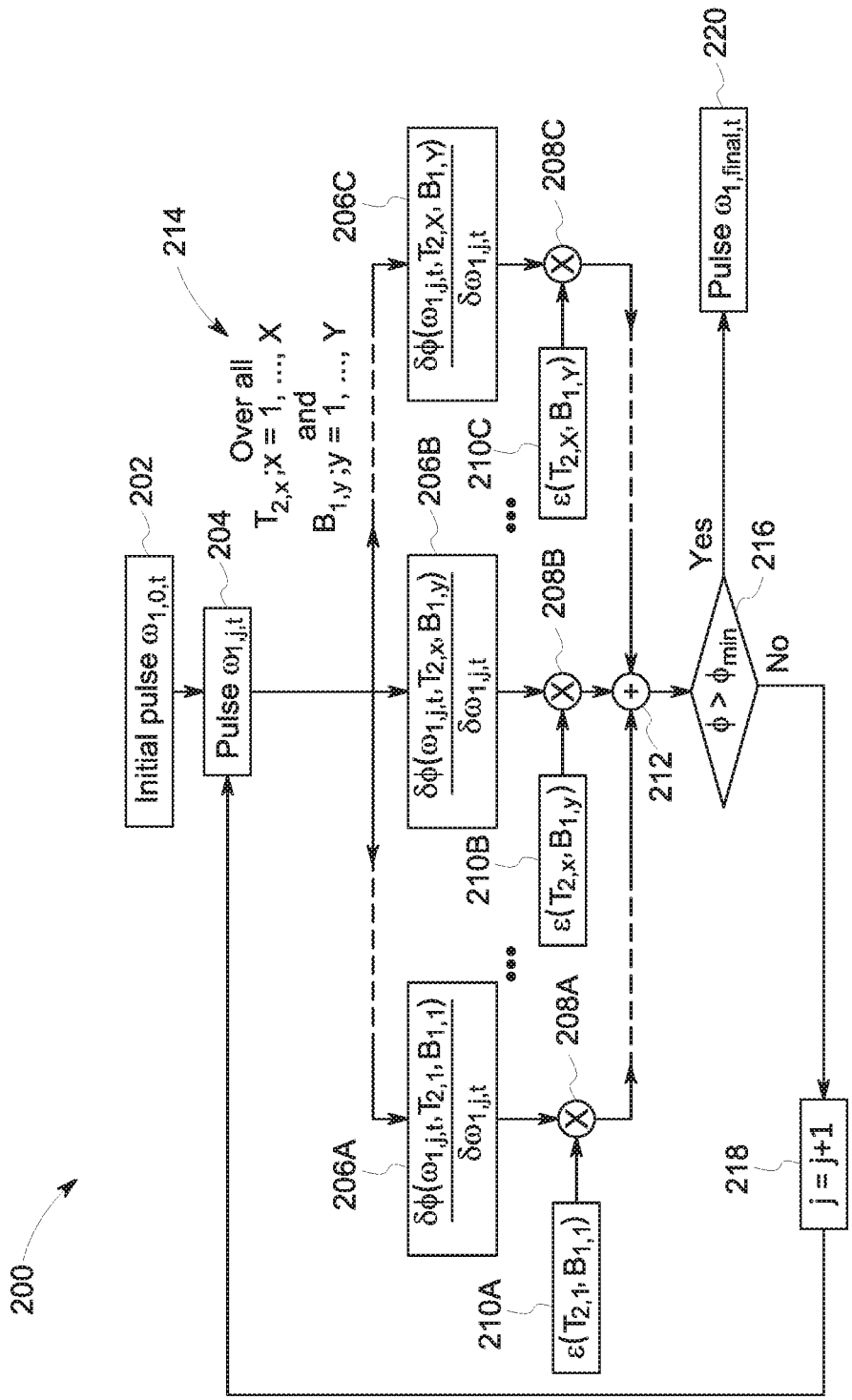
FIG. 4 illustrates a flow chart of a technique to obtain a $T_2$ preparatory pulse sequence that maximizes a quality function based on $T_2$ relaxation times and magnetic field inhomogeneity, in accordance with an embodiment of the present disclosure.

A more detailed method 200 for obtaining an RF pulse is depicted in FIG. 4. That is, the method 200 of FIG. 4 illustrates an implementation of the method 150 of FIG. 3. The method 200 may be an iterative method to obtain an RF pulse that satisfies a pulse quality threshold. For each iteration, the candidate pulse sequence may be represented by $\omega_{1,j,t}$, wherein j identifies the iteration and t represents discrete time steps t=1, 2, . . . , N. At the beginning of method 200, an initial pulse sequence $\omega_{1,0,t}$ (block 202) is set as a candidate pulse sequence $\omega_{1,j,t}$ 204 for the initial iteration (j=0). As discussed above, a pulse sequence may contain instructions for the RF excitation coil that generates a magnetic field, or it could be a description of the RF excitation magnetic field generated by the coils.

The candidate pulse may be evaluated with a functional operator (e.g., gradient operator, derivative operator) of a quality function Φ evaluated with a given set of parameters, as detailed below. In the illustrated method, block 206A employs a gradient of the quality function Φ with respect to the RF pulse sequence, with evaluation parameters $T_{2,1}$ as a $T_2$ relaxation time and $B_{1,1}$ as the magnetic field. The resulting gradient may be multiplied 208A by a weight $\varepsilon(T_{2,1}, B_{1,1})$ associated with the evaluation parameters employed (block 210A) to obtain a weighted sum (operation 212). The output of the weighted sum 212 may be used in a next iteration, as detailed below.

The method 200 may apply the gradient operator (blocks 206A-C) and weighting (blocks 208A-C and blocks 210A-C) over a set of several values of the evaluation parameters, as shown by a parameter range 214. The set of weights (blocks 208A-C) may be used to assign a higher or a lower contribution of the quality function component based on the relative importance of the corresponding values for the evaluation parameters. The evaluation parameters may be related to the material parameter of interest, such as $T_2$ relaxation time, or an undesirable effect, such as $B_1$ inhomogeneity. Other parameters related to $T_1$ relaxation times, specific absorbance rate, spin-coupling effects, flow velocity, off-resonance effects from B0 and chemical shift, and other effects may be contemplated in the parameter range 214 and employed in the calculation of the functional operator (blocks 206A-C).

A quality of the candidate pulse may be compared to a quality threshold at block 216. In some implementations, the quality may be obtained from the weighted sum 212. In the illustrated example, the quality function may be calculated separately, as detailed below, and the quality of the candidate pulse is compared with a minimum threshold. If the quality is lower than the quality threshold, the candidate pulse sequence is updated (j=j+1, illustrated in block 218) via a combination of the weighted sum of the gradients $$\frac{\delta \Phi(\omega_{1,j,t})}{\delta \omega_{1,j,t}} (\text{sum } 212)$$

with the candidate pulse sequence $\omega_{1,j,t}$. If the quality is higher than the quality threshold, the candidate pulse sequence may be used as the preparatory RF pulse sequence ($\omega_{1,final,t}$). In some applications, the quality function may be compared to a maximum threshold and the iteration or finalization of method 200 may be adjusted accordingly.

Figure 5:
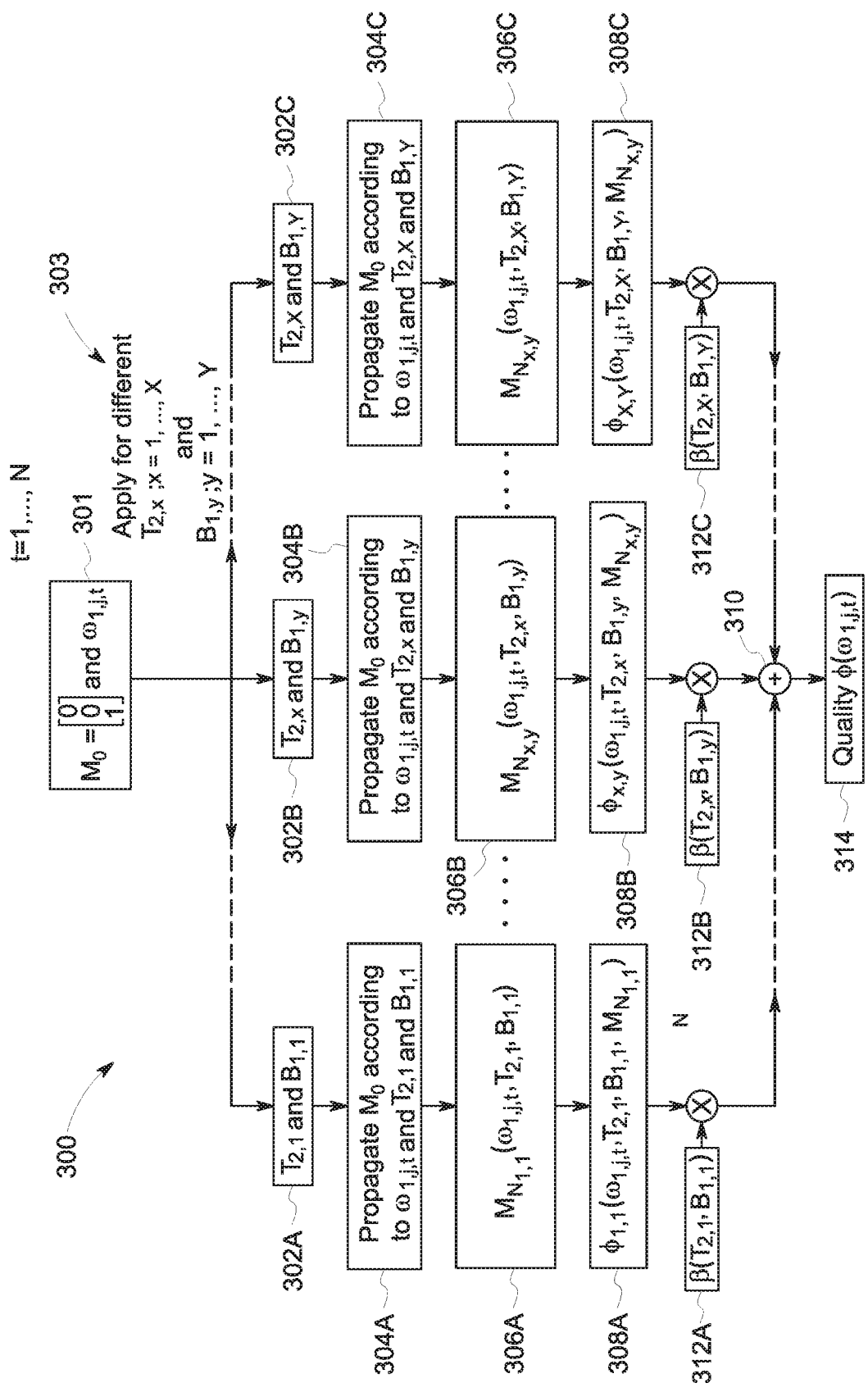
FIG. 5 illustrates a flow chart of a technique to determine a quality function based on $T_2$ relaxation times and magnetic field inhomogeneity, in accordance with an embodiment of the present disclosure.

FIG. 5 illustrates an embodiment of a method 300 to calculate the quality of a candidate pulse sequence ($\omega_{1,j,t}$, with the discrete time steps t=1, 2, ..., N). An equilibrium magnetization $M_0$ and the candidate pulse sequence ($\omega_{1,j,t}$) may be initialized (block 301). The equilibrium magnetization may be related to a thermal equilibrium magnetization of a gyromagnetic material under the main magnetic field and/or a gradient magnetic field, prior to an application of an excitation pulse sequence. For each parameter set (shown as including 302A, 302B and 302C) of a range of parameter values 303, the equilibrium magnetization $M_0$ may be propagated (blocks 304A-C) according to the parameter set and the candidate pulse sequence ($\omega_{1,j,t}$). The propagation may employ a simulation based on Bloch Equations, which may include relaxation. In other implementations, the propagation may employ an analytical function that provides a final magnetization state based on an initial magnetization, the candidate pulse sequence and the parameter set. The output of the propagation step may be a magnetization evolution curve (see FIG. 7), represented by a time sequence of 3-dimension magnetization vectors. In the illustrated diagram, the output of the propagation (blocks 304A-C) is the final state of magnetization $M_N$ 306A-C.

The output of the propagation may be used to obtain a quality subfunction Φ 308A-C. The quality subfunction may be used to penalize candidate pulse sequences that provide low contrast or are susceptible to undesirable artifacts. In the example, the quality subfunction 308A-C may assign a higher value of quality to candidate pulse sequences that lead to different final magnetization states (306A-C) when the $T_2$ relaxation time changes. The quality subfunction 308A-C may also assign a higher value of quality to candidate pulse sequences that lead to substantially similar final magnetization states 306A-C independent of inhomogeneity of a $B_1$ magnetic field. This may be accomplished by comparing the final magnetization state $M_N$ with a target magnetization state $M_T$. As an example, the quality subfunction may be a vector product cost function, shown in equation (1) below:

$$\Phi_1(\omega_{1,j,t}, T_{2,1}, B_{1,1}, M_N, M_T) = \qquad (1)$$

$$M_T' * M_N = [M_{x,T}, M_{y,T}, M_{z,T}] * \begin{bmatrix} M_{x,N} \\ M_{y,N} \\ M_{z,N} \end{bmatrix}.$$

In other examples, the cost function may be a norm difference, such as the one shown in equation (2) below:

$$\Phi_2(\omega_{1,j,t}, T_{2,1}, B_{1,1}, M_N, M_T) = |M_T - M_N|. \qquad (2)$$

Here, the norm may be any vector norm, such as an Euclidian norm, a Manhattan distance, a zero norm, a maximum norm or any other useful operators that may be used to compare two vectors. The quality subfunction may also be used to compare the entire magnetization evolution (i.e., the magnetization over time) with a target magnetization evolution.

The target magnetization state $M_T$ may be chosen based on the criteria discussed above. For example, in a pulse with total duration T, the target magnetization state may be represented by equation (3):

$$M_T = \begin{bmatrix} 0 & 0 & f\left(-\frac{T}{T_2}\right) \end{bmatrix}. \qquad (3)$$

The target magnetization state $M_T$ may depend on the value of the $T_2$ parameter but does not depend on the $B_1$ value. As discussed above, a quality subfunction calculated based on this criteria may emphasize sensitivity toward the $T_2$ parameter and be robust to variations in the $B_1$ parameter. Moreover, the function $$f\left(-\frac{T}{T_2}\right)$$

described above may be used to assign a specific weighting scaling (e.g. exponential, linear, inverse linear, logarithmic) to the target function. For example, a quality subfunction using a vector product and that employs an exponential scaling (with p as a scaling factor) for longitudinal magnetization may be represented by equation (4):

$$\Phi_3(\omega_{1,j,t}, T_{2,1}, B_{1,1}, M_N, M_T) = \left[0, 0, pe^{-\frac{T}{T_2}}\right] * \begin{bmatrix} M_{x,N} \\ M_{y,N} \\ M_{z,N} \end{bmatrix}. \quad (4)$$

Other effects such as $T_1$ relaxation times, specific absorbance rate, spin-coupling, flow velocity, off-resonance from $B_0$, chemical shifts, or other such effects may be contemplated in the parameter range 303 and may be employed during propagation (blocks 304A-C) and/or calculation of the quality subfunction (blocks 308A-C). For example, the parameter range 303 may include $B_0$ off-resonance or chemical-shift frequencies, e.g., a range $f=-F_{min}, \ldots, -1$ Hz, 0 Hz, 1 Hz, $\ldots$, $F_{max}$. In this example, parameter f may be included in Bloch Equations simulation (blocks 304A-C). The target magnetization vector $M_T$ may be uniform across all values of f, or it may be modulated based on desired target states. In another implementation, specific absorbance rate may be included in the method 300 by adding a side constraint which may limit or provide a weighting to the sum of the squared RF pulse amplitude corresponding to the specific absorbance rate of the RF pulse. Constraints that may limit the RF pulse amplitude (e.g. a maximum constraint) can be implemented by truncating the RF pulse amplitude at the desired limit for the RF pulse amplitude in each iteration of method 300. This limit constraint may be implemented, for example, when hardware specification limits the RF pulse amplitude specifications. In further implementations, effects from motion and flow may be mitigated by performing the RF pulse sequence optimization in a 4-dimensional spatio-temporal space.

A weighted sum 310 using a set of weights 312A-C may be used to assign a higher or a lower contribution of the quality subfunction to the final quality value 314 based on the relative importance of the corresponding parameters set. In some applications, the set of weights 312A-C may be substantially similar to the set of weights 210A-C used to combine the functional operators. In some applications all the weights may be assigned to be 1.

While the example implementation of aspects of the method 150 of FIG. 2 illustrated in methods 200 of FIGS. 3 and 300 in FIG. 4 may provide an RF excitation pulse sequence that optimizes a contrast for $T_2$-weighted image and is robust to $B_1$ variation, the method may be adapted to provide pulse sequences that optimize different contrasts and are robust to different effects. This may be achieved by introducing the relevant parameters to the simulation/propagation processes (block 156 of FIG. 3 or blocks 304A-C of FIG. 5) and adjusting the quality function Φ and the target magnetization state $M_T$ accordingly.

Moreover, while the example processes of FIG. 4 and FIG. 5 refine an excitation pulse sequence with a single pulse (i.e., a single target magnetization state), the methods may be adapted to obtain a pulse sequence with multiple separate pulses. This may be accomplished by applying the method to multiple pulse candidates, with a separate initial magnetization state $M_0$ and a separate final magnetization state $M_T$ for each pulse candidate. Such a method may be used, for example, to obtain an optimized pulse sequence which includes a preparatory excitation RF pulse, refocusing RF pulses and a flip-back RF pulse.

Figure 6:
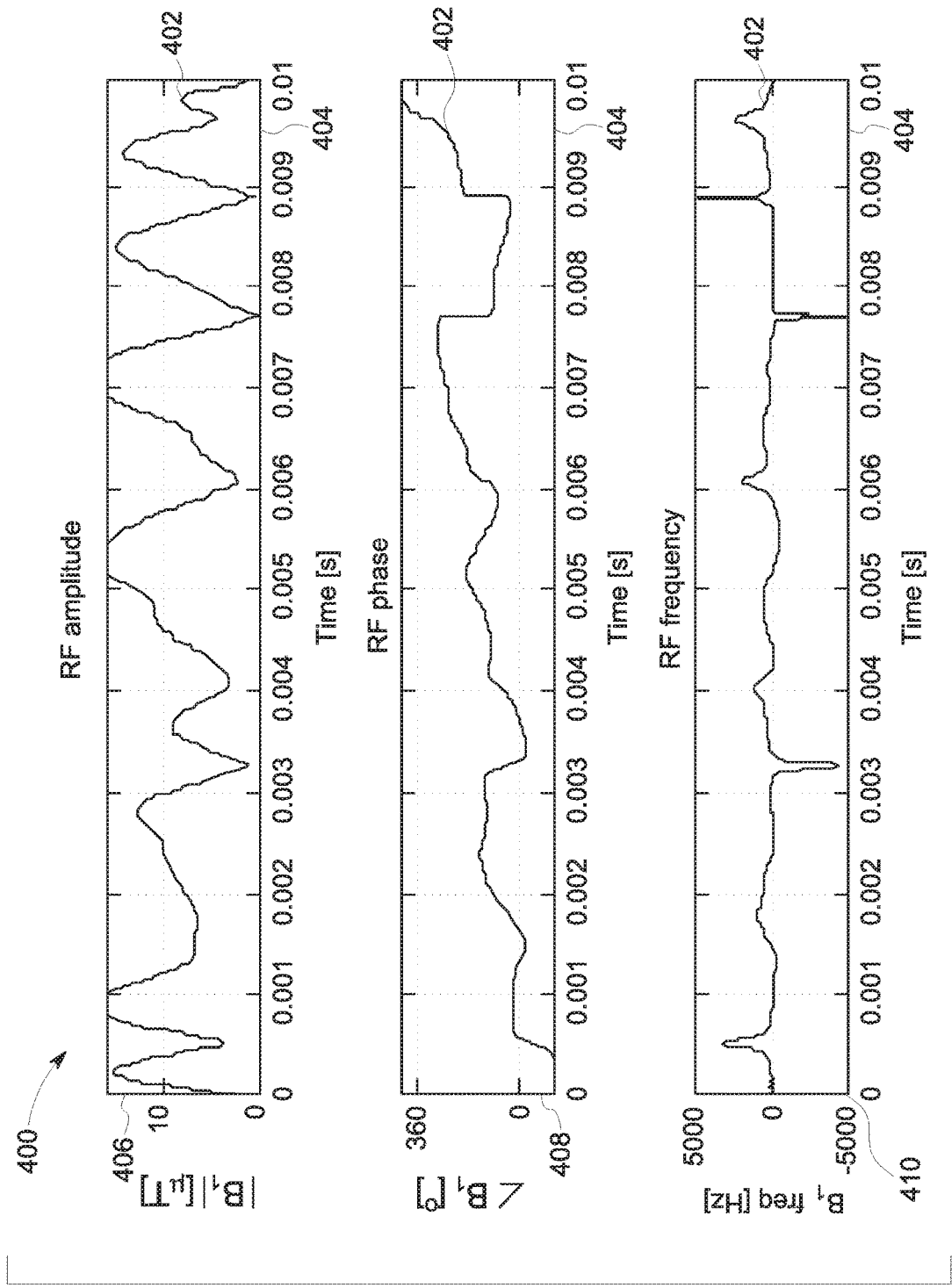
FIG. 6 illustrates a graphical representation of components of an example of a $T_2$ preparation RF pulse sequence obtained by the method of FIG. 4, in accordance with an embodiment of the present disclosure.

FIG. 6 illustrates a chart 400 of a single RF pulse sequence 402 that may be produced application of method 150 to the production of an RF pulse. Chart 400 illustrates a time evolution (axis 404) of the RF pulse sequence 402 as a function of magnitude 406, phase 408 and frequency 410. The RF pulse sequence 402 is a pulse sequence consisting of a single pulse with duration of 10 ms and with substantial variations in the magnitude, phase and frequency over time.

Figure 7:
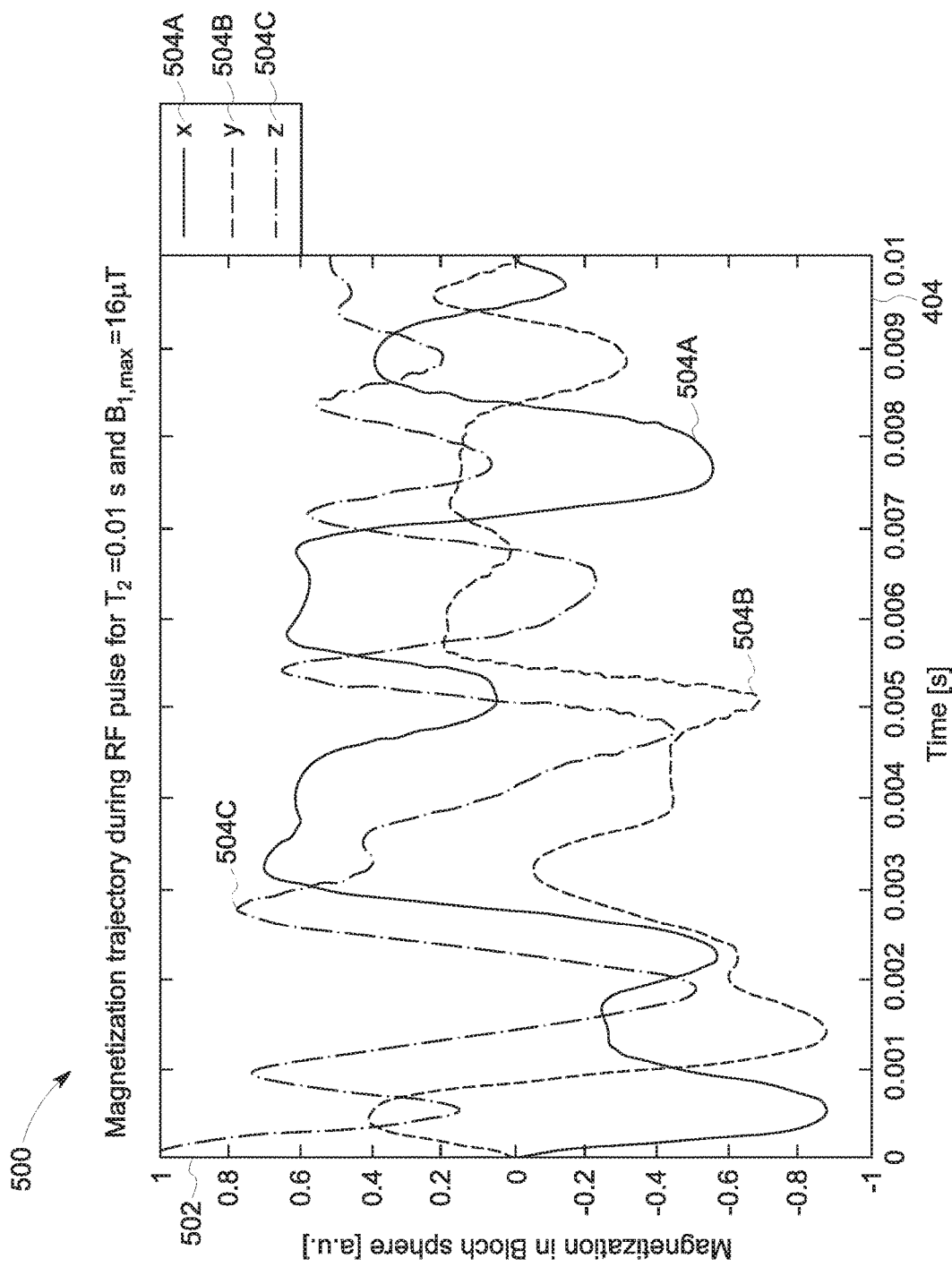
FIG. 7 illustrates a graphical representation of the magnetization as a function of time of an object subjected to the $T_2$ preparatory RF pulse sequence of FIG. 6, in accordance with an embodiment.

Plot 500 of FIG. 7 illustrates the effect of the RF pulse sequence 402 of FIG. 6 in the magnetization state. The evolution of the magnetization vector is represented as a time 404 evolution of the magnitude 502 of the three dimensional components (504A, 504B and 504C) of the magnetization vector. In particular, note that at time t=0, the transverse components of the vector (504A and 504B) are at zero while the longitudinal component 504C starts at 1, representing an initial state $M_0$=[0 0 1]. While the magnetization vector freely moves and rotates during the application of the pulse, the final magnetization state, at time t=00 ms, $M_N$ has its transverse components 504A and 504B substantially close to zero, while the longitudinal component 504C is substantially close to 0.5, close to the desired final magnetization state $M_T$ for a material with $T_2$=0.01 s.

Figure 8:
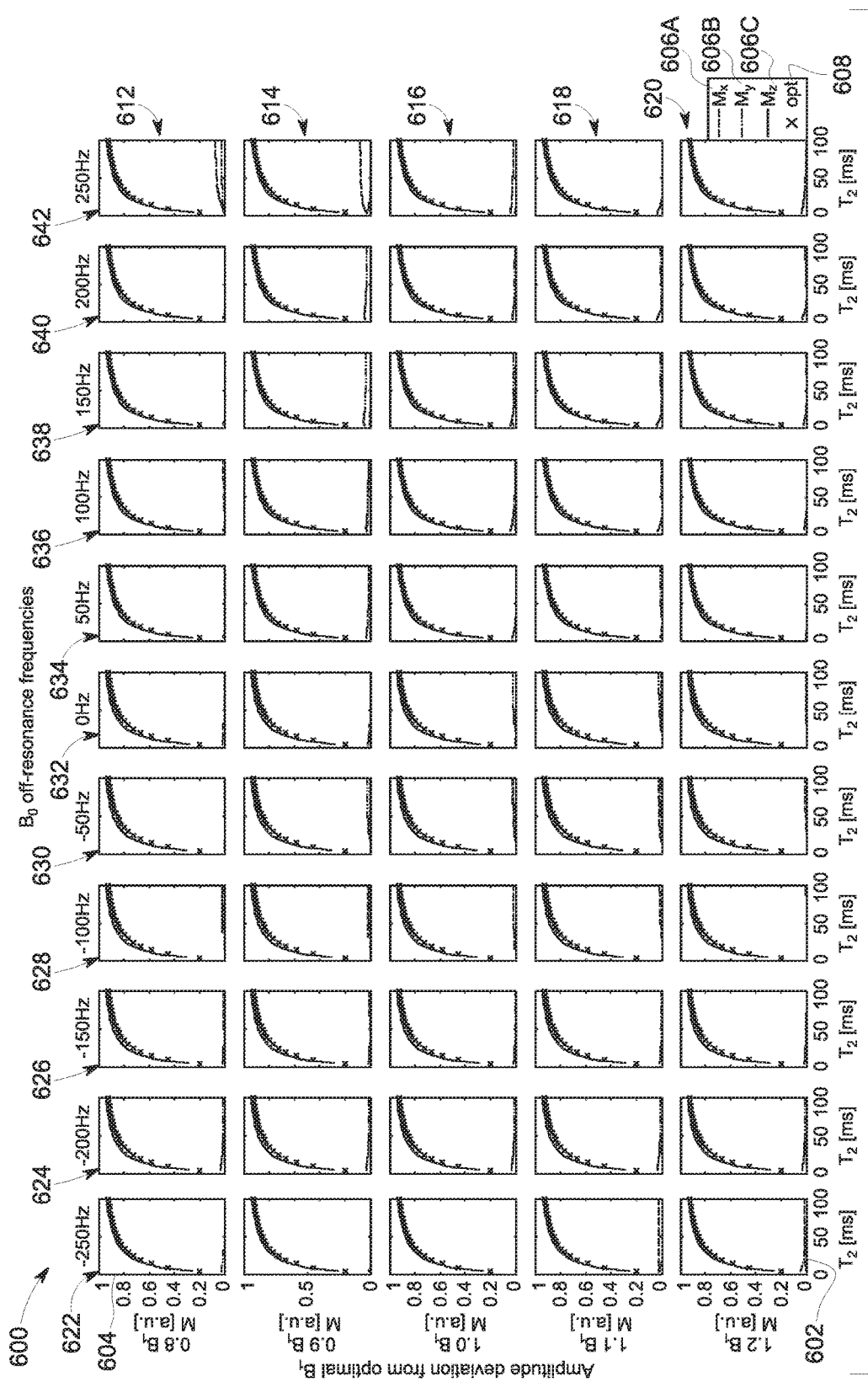
FIG. 8 illustrates a series of magnetization evolution curves as a response to a single $T_2$ preparation RF pulse sequence under different magnetic field perturbations caused by magnetic field inhomogeneity, the single RF pulse in accordance with an embodiment.

Chart series 600 of FIG. 8 demonstrates the robustness of an RF pulse sequence obtained using method 150 with respect to magnetic $B_1$ field inhomogeneity and B0 off-resonance frequencies. Each plot in the series provides a final magnetization state $M_N$ 604 at the end of the preparatory RF pulse sequence, for different $T_2$ relaxation parameters 602. Each plot shows the transverse components of the magnetization state $M_N$ (606A and 606B), longitudinal component of the magnetization state $M_N$ 606C and an expected value of the longitudinal magnetization component 608.

For each plot, the magnetization vector was propagated using the same RF pulse sequence, but under distinct $B_0$ and $B_1$ magnetic fields. Each row illustrates the effect of variations to the $B_1$ magnetic field. Row 612 was evaluated with a $B_1$ that is 80% of the nominal $B_1$ value, row 614 evaluated with 90% of the nominal $B_1$ value, row 616 evaluated with the nominal $B_1$ value, Row 618 with 110% of the nominal $B_1$ value and row 620 with 120% of the nominal $B_1$ value. Each column illustrates the effect of off-resonance frequencies from the main $B_0$ field. Rows 622, 624, 626, 628, 630, 632, 634, 636, 638, 640, and 642 illustrate the effect to an off-resonance effect of −250 Hz, −200 Hz, −150 Hz, −100 Hz, −50 Hz, 0 Hz, 50 Hz, 100 Hz, 150 Hz, 200 Hz, and 250 Hz, respectively. Note that the expected value of the longitudinal magnetization component 608 is substantially aligned with the measured longitudinal component of the magnetization state 606C. These results show that the measured magnetization state is substantially robust to variations of both magnetic fields.

Technical effects of the invention include methods and systems that may provide RF pulses that may be used for $T_2$ preparation pulse sequences. The RF pulses may be used for other types of MRI techniques, as discussed above. Moreover, the RF pulse sequences obtained may be optimized for specific $B_1$ durations and specific absorption rate constraints at different $B_0$ fields, particularly with very strong fields.

The RF pulse sequences may be robust to $B_0$ and $B_1$ inhomogeneity. This may be particularly relevant in applications with magnetic fields with strengths larger than 3T for all anatomies. In particular, a $T_2$ preparation module as the ones described above may be used to obtain fMRI preparation followed by 3D acquisition and to achieve improved blood-myocardium contrast in cardiac imaging. For example, the method to obtain RF pulse sequences may be optimized to obtain temporal changes in $T_2$ that may be associated with changes in blood deoxyhemoglobin relative to blood oxyhemoglobin. The method may be used to obtain RF pulse sequences that may be optimized to maximize a contrast between blood pool and myocardium in the heart. Moreover, the RF pulse sequences provided may be robust to artifacts arising from blood flow, cardiac motion and other types of artifacts common to cardiac imaging.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging method employing a preparatory radiofrequency (RF) pulse sequence that enhances a target T2 relaxation contrast, wherein the preparatory RF pulse sequence is obtained using a method comprising:
   simulating a magnetization evolution of a gyromagnetic material based on a candidate RF pulse sequence, a parameter of the gyromagnetic material, and magnetic fields generated within the gyromagnetic material;
   calculating a quality of the candidate RF pulse sequence based on the magnetization evolution of the gyromagnetic material and the target T2 relaxation contrast;
   updating the candidate RF pulse sequence based on the magnetization evolution of the gyromagnetic material and the target T2 relaxation contrast and in response to a comparison between the quality of the candidate RF pulse sequence and a quality threshold, wherein updating the candidate RF pulse sequence improves the quality of the candidate RF pulse sequence relative to the quality threshold; and
   providing the candidate RF pulse sequence as the preparatory RF pulse sequence in response to the comparison between the quality of the candidate RF pulse sequence and the quality threshold.

2. The method of claim 1, wherein the magnetic fields comprise a combination of a primary magnetic field, a magnetic field gradient and magnetic field inhomogeneity.

3. The method of claim 1, wherein simulating the magnetization evolution of the gyromagnetic material comprises propagating an initial magnetization vector based on an application of Bloch equations adapted to the candidate RF pulse sequence, the gyromagnetic material parameter and the magnetic fields, to obtain the magnetization evolution of the gyromagnetic material.

4. The method of claim 1, wherein calculating the quality of the candidate RF pulse sequence based on the magnetization evolution of the gyromagnetic material comprises:
   calculating a target state of magnetization of the gyromagnetic material based on the target T2 relaxation contrast; and
   comparing a final state of the magnetization evolution of the gyromagnetic material to the target state of magnetization.

5. The method of claim 4, wherein updating the candidate RF pulse sequence comprises:
   calculating an update gradient using an update function based on an application of a gradient operator to a quality function that compares the final state of the magnetization evolution of the gyromagnetic material with the target state of magnetization; and
   combining the candidate RF pulse with the update gradient.

6. The method of claim 5, wherein the gradient operator comprises a derivative of the quality function with respect to the candidate RF pulse sequence.

7. The method of claim 1, wherein:
   simulating the magnetization evolution of the gyromagnetic material comprises performing multiple simulations over a set of material parameter values and a set of magnetic field vectors, wherein each simulation is based on the candidate RF pulse sequence, a material parameter value of the set of material parameter values, and a magnetic field vector from the set of magnetic field vectors, and each simulation produces a magnetization evolution trajectory associated with the respective material parameter value and the respective magnetic field vector;
   calculating the quality of the candidate RF pulse comprises applying a quality subfunction to each magnetization evolution trajectory to produce a respective quality value associated with the respective material parameter value and the respective magnetic field vector, and performing a first weighted sum of the quality values; and
   updating the candidate RF pulse comprises performing a gradient operation of the quality subfunction for each magnetization evolution trajectory with respect to the candidate RF pulse to obtain a set of gradient values, and combining the candidate RF pulse with a second weighted sum of the set of gradient values.

8. The method of claim 7, wherein the first weighted sum and the second weighted sum employ the same weights.

9. The method of claim 7, wherein each quality subfunction comprises a vector product between a final state of magnetization of a respective magnetization evolution curve and a respective target state of magnetization based on the respective material parameter value, the respective magnetic field vector, and the target T2 relaxation contrast.

10. The method of claim 7, wherein the set of magnetic field vectors correspond to combinations of a main magnetic field of a magnetic resonance imaging system, a gradient magnetic field of the magnetic resonance imaging system and magnetic field inhomogeneity, wherein the quality subfunction quantifies the magnetic field inhomogeneity, and wherein the preparatory RF pulse sequence is substantially robust to the magnetic field inhomogeneity.

11. The method of claim 7, wherein the set of material parameter values correspond to $T_2$ relaxation times of a subject being imaged, wherein the quality subfunction quantifies a $T_2$-weighted contrast, and wherein the preparatory RF pulse sequence is a $T_2$ preparatory RF pulse.

12. The method of claim 1, wherein the magnetic resonance imaging method is a functional magnetic resonance method, and the target $T_2$ relaxation contrast emphasizes temporal changes in $T_2$ related to changes in blood deoxyhemoglobin relative to oxyhemoglobin.

13. The method of claim 1, wherein the target $T_2$ relaxation contrast emphasizes a contrast between blood pool and myocardium tissue in a heart of a subject being imaged.

14. A magnetic resonance imaging system comprising a pulse calculation module configured to perform a method to generate a T2 preparatory radiofrequency (RF) pulse sequence that enhances a target T2 relaxation contrast, the method comprising:

simulating a magnetization evolution of a gyromagnetic material based at least on a candidate RF pulse sequence and a magnetic field generated within the gyromagnetic material;

calculating a quality of the candidate RF pulse sequence based on a comparison between the magnetization evolution of the gyromagnetic material and a target magnetization evolution of the gyromagnetic material calculated from the target T2 relaxation contrast; and updating the candidate RF pulse sequence based in part on the comparison between the magnetization evolution of the gyromagnetic material and the target magnetization evolution of the gyromagnetic material and in response to a comparison between the quality of the candidate RF pulse sequence and a quality threshold.

15. The magnetic resonance imaging system of claim 14, comprising:
a set of RF coils; and
an RF coil controller configured to apply the preparatory RF pulse sequence to a subject being imaged using the RF coils.

16. The magnetic resonance system of claim 14, wherein the quality of the candidate RF pulse sequence quantifies $B_0$ off-resonance, chemical shift effects, $T_1$ relaxation times, $T_2$ relaxation times, spin-coupling effects, flow velocity effects, or specific absorption rate effects, or any combination thereof.

17. The magnetic resonance system of claim 14, wherein the preparatory RF pulse sequence consists of a single RF pulse.

18. The magnetic resonance system of claim 14, wherein the preparatory RF pulse sequence comprises multiple RF pulses.

19. A preparation module configured for use with a magnetic resonance imaging system and configured to perform a process to generate a radiofrequency (RF) pulse sequence that enhances a target $T_2$ relaxation contrast, the method comprising:

simulating a magnetization evolution of a gyromagnetic material based at least on a candidate RF pulse sequence, a material parameter of the gyromagnetic material, and a magnetic field generated within the gyromagnetic material;

calculating a quality of the candidate RF pulse sequence based on a comparison between the magnetization evolution and a target magnetization evolution of the gyromagnetic material calculated from the target $T_2$ relaxation contrast; and updating the candidate RF pulse sequence based in part on the comparison between the magnetization evolution and the target magnetization evolution and in response to determining that the quality of the candidate RF pulse sequence is below a quality threshold.

20. The method of claim 19, wherein the preparation module comprises an application specific integrated circuit, or a programmable logic device or both, or comprises a network of servers connected to the magnetic resonance imaging system.

* * * * *